(12) United States Patent
Klomsdorf et al.

(10) Patent No.: US 6,794,935 B2
(45) Date of Patent: Sep. 21, 2004

(54) POWER AMPLIFICATION CIRCUIT AND METHOD FOR SUPPLYING POWER AT A PLURALITY OF DESIRED POWER OUTPUT LEVELS

(75) Inventors: Armin Klomsdorf, Libertyville, IL (US); Clark Conrad, Chicago, IL (US); Matthew Greene, Crystal Lake, IL (US)

(73) Assignee: Motorola Inc., Schaumburg, IL (US)

(*) Notice: Subject to any disclaimer, the term of this patent is extended or adjusted under 35 U.S.C. 154(b) by 0 days.

(21) Appl. No.: 10/272,964

(22) Filed: Oct. 17, 2002

(65) Prior Publication Data

US 2004/0075494 A1 Apr. 22, 2004

(51) Int. Cl.[7] .................................................. H03G 3/20
(52) U.S. Cl. ....................... 330/129; 330/284; 330/285; 330/296; 455/127
(58) Field of Search ................................ 330/129, 284, 330/285, 296; 455/127

(56) References Cited

U.S. PATENT DOCUMENTS

| | | |
|---|---|---|
| 4,348,644 A | 9/1982 | Kamiya |
| 4,442,407 A | 4/1984 | Apel |
| 5,060,294 A | 10/1991 | Schwent et al. |
| 5,101,172 A | 3/1992 | Ikeda et al. |
| 5,625,322 A | 4/1997 | Gourgue et al. |
| 5,673,001 A | 9/1997 | Kim et al. |
| 6,020,787 A | 2/2000 | Kim et al. |
| 6,160,449 A | 12/2000 | Klomsdorf et al. |
| 6,166,598 A | 12/2000 | Schlueter |
| 6,281,748 B1 * | 8/2001 | Klomsdorf et al. .......... 330/129 |
| 6,349,216 B1 | 2/2002 | Alberth, Jr. et al. |
| 6,556,814 B1 | 4/2003 | Klomsdorf et al. |
| 2003/0141927 A1 * | 7/2003 | Barnett ........................ 330/129 |

* cited by examiner

Primary Examiner—Michael B Shingleton
(74) Attorney, Agent, or Firm—Lawrence Chapa

(57) ABSTRACT

The present invention provides a method and apparatus for supplying power to a load at a plurality of different power levels. The method includes changing between high and low power outputs of the power amplifier when amplifying a signal having a common modulation format. A different bias is applied to the power amplifier at the low power output than the bias applied to the power amplifier at the high power output. The output of the power amplifier is loaded with a different impedance at the low power output than the impedance loaded at the output of the power amplifier output at the high power output. In at least one embodiment, the power amplifier changes between high and low power outputs at a different threshold level dependant upon whether the power amplifier is transitioning from the high power output to the low power output, or whether the power amplifier is transitioning from the low power output to the high power output.

16 Claims, 8 Drawing Sheets

POWER AMPLIFICATION CIRCUIT AND METHOD FOR SUPPLYING POWER AT A PLURALITY OF DESIRED POWER OUTPUT LEVELS

FIELD OF THE INVENTION

The present invention relates generally to a power amplification circuit and method for supplying power at a plurality of desired power output levels, and more particularly to a power amplification circuit, which adjusts the load coupled to the output of the power amplifier, responsive to the desired power output levels, to enable further reductions in the amplifier bias signal without exceeding predefined distortion limits.

BACKGROUND OF THE INVENTION

Many wireless communication protocols provide for transmitters, operating within a communication network, which are capable of transmitting at varying levels of output power. One reason for having varying levels of output power is to accommodate mobile transmitters, which may be located at a varying distance from a base station. In some instances, the wireless communication protocol requires that the signal being received by the base station is received at a relatively constant or fixed power level. Examples of two such protocols include Code Division Multiple Access (CDMA) or Wideband Code Division Multiple Access (WCDMA). To accommodate this requirement, a mobile transmitter will transmit at one of several power output levels, dependent upon the level at which the signal is being received.

Other examples, where the transmitted output power can be varied, include the Global System for Mobile communications (GSM), which provides for a range of output power control of mobile transmitters between 20 dB and 30 dB, which is controllable in steps of 2 dB, and earlier analog cellular standards, which call for seven 4 dB steps in power output of the radio transmitter.

Previously, power amplifiers that were capable of delivering a range of power outputs were often designed to operate most efficiently at the highest power level. This is because relatively larger amounts of power are consumed, when the power amplifiers are operating at the highest power levels, than when power amplifiers are operating at lower power levels. Consequently, this has generally resulted in power amplifiers, which sacrificed power efficiencies at lower power levels. However, the mobile station is generally only required to transmit at its maximum power level when the path losses are the greatest. Correspondingly, the mobile station will typically transmit at lower power levels for a larger percentage of the time, that the mobile station is transmitting.

One previous technique, which has been used to enhance operating efficiencies at lower power output values, has included reducing the bias signal supplied to the amplifier. However, there is a limit to the amount that the bias signal can be reduced. Reducing the bias too much will lead to distortion, and increase the likelihood that adjacent channel power requirements will not be met.

A further technique, which has been used to enhance operating efficiencies at lower power output values, is to adjust the load impedance coupled to the output of the power amplifier. However, as the power output value moves further away from the original maximum required, a greater impedance change becomes necessary to maintain performance.

At least one prior reference has attempted to accommodate changes in the transmitter operating environment by making adjustments in the power amplifier circuit, namely, Klomsdorf et al., U.S. Pat. No. 6,281,748, entitled "Method And Apparatus for Modulation Dependent Signal Amplification", which is assigned to Motorola, the disclosure of which is incorporated herein by reference. Klomsdorf et al. discloses a multi-mode communications transmitter capable of transmitting a signal having different modulation formats, for example quaternary phase shift keying (QPSK), binary phase shift keying (BPSK), and/or quadrature amplitude modulation (QAM). The transmitter comprises an amplifier having a modulation format switch with different impedance values for the different communication modulation formats.

Klomsdorf et al. also discloses reducing power consumption in the power amplifier by adjusting a bias applied thereto. For further example, see U.S. Pat. No. 5,625,322, entitled "Amplifier Bias Control Device", among other patents.

However, the present inventors have recognized, that at low power output levels, by reducing the impedance coupled to the output of the power amplifier, the bias signal can be reduced even further, while the amount of noise or power transmitted in an adjacent channel remains below the adjacent channel power requirements. As a result greater efficiencies at lower power output levels can be realized without sacrificing power efficiencies at higher power output levels.

SUMMARY OF THE INVENTION

The present invention provides a method in a power amplifier of supplying power to a load at a plurality of different power levels. The method includes changing between high and low power outputs of the power amplifier when amplifying a signal having a common modulation format. A different bias is applied to the power amplifier at the low power output than the bias applied to the power amplifier at the high power output. Additionally, the output of the power amplifier is loaded with a different impedance at the low power output than the impedance loaded at the output of the power amplifier output at the high power output.

In at least one embodiment, the power amplifier changes between high and low power outputs at a different threshold level dependant upon whether the power amplifier is transitioning from the high power output to the low power output, or whether the power amplifier is transitioning from the low power output to the high power output.

In a still further embodiment, a method of supplying power to a load via a power amplification circuit over an extended range includes defining a set of a plurality of desired power output levels, where each power output level is a subset of the extended range. A bias signal supply level and an output impedance is associated with each desired power output levels. A desired power output level is then selected. The bias signal supply level is then adjusted, and an output impedance is then selected, corresponding to the selected desired power output level. A signal is then received by the power amplification circuit and amplified.

The present invention further provides a power amplification circuit, which includes a power amplifier having an output with high and low output power levels within an operating range of the power amplification circuit. The power amplification circuit further includes a variable bias circuit coupled to the power amplifier, where the variable bias circuit has at least a first and second power amplifier bias configurations, and a variable impedance circuit coupled to the output of the power amplifier, where the variable impedance circuit has at least a first and second power amplifier impedance configurations. The power amplifier is configured in a reduced bias configuration at the low output power level relative to the bias configuration of the power amplifier at the high output power level, and the power amplifier is loaded with an increased impedance at the low output power level relative to the loading of the power amplifier at the high output power level.

In a further embodiment, the power amplification circuit includes a control circuit including a bias adjust circuit, and an impedance select circuit, for receiving a signal, which selects one of the desired output power levels, and for producing a bias adjust control signal and an impedance select control signal, which are respectively received by the variable bias circuit and the variable impedance circuit.

The various aspects, features and advantages of the present invention will become more fully apparent to those having ordinary skill in the art upon careful consideration of the following Detailed Description of the Invention with the accompanying drawings described below.

DETAILED DESCRIPTION OF THE INVENTIONS

Figure 1:
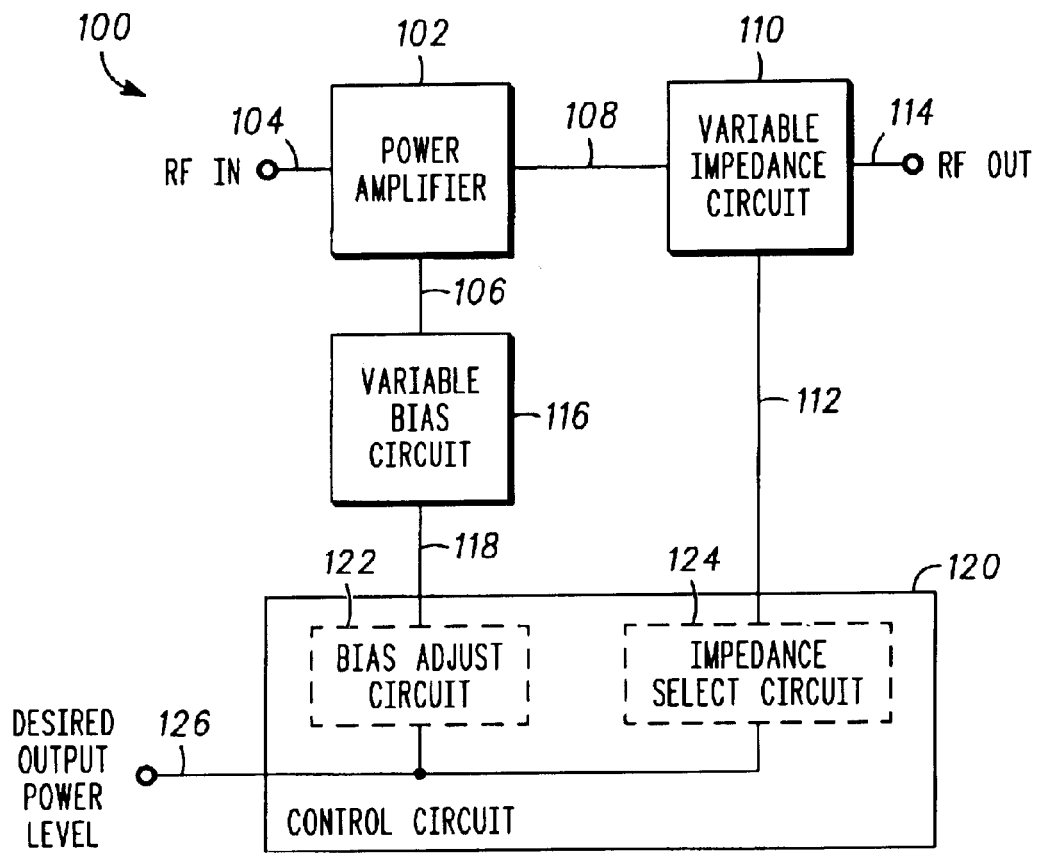
FIG. 1 is a block diagram of a power amplification circuit, in accordance with at least one embodiment of the present invention.

FIG. 1 illustrates a power amplification circuit 100 for supplying power to a load over an extended range including a set of a plurality of predefined desired power output levels in accordance with at least one embodiment of the present invention. The power amplification circuit 100 includes a power amplifier 102, which has an input 104 for receiving a signal to be amplified, a second input 106 for receiving a bias signal, and an output 108 at which an amplified signal is produced.

The output of the power amplifier 102 is coupled to a variable impedance circuit 110. The variable impedance circuit 110 includes a plurality of impedance states, which are separately selectable, each impedance state presents a potentially different impedance to the output 108 of the power amplifier 102. Selection of the particular impedance state is controlled by an impedance select control signal 112. The output of the variable impedance circuit produces the amplified output signal 114 of the power amplification circuit 100, which might be forwarded to an antenna for radiating a wireless communication signal.

The bias signal, received by the power amplifier via the second input 106, is produced by a variable bias circuit 116. The variable bias circuit is capable of producing a variable supply level, where the level of the supply is generally controlled by a bias adjust control signal 118. In at least the illustrated embodiment, the bias adjust control signal 118 and the impedance select control signal 112 are produced by a control circuit 120. The bias adjust control signal 118 is produced by a bias adjust circuit 122 and the impedance select control signal 112 is produced by an impedance select circuit 124. Both the bias adjust circuit 122 and the impedance select circuit 124 receive a desired output power level signal 126 from which the impedance select control signal and the bias adjust control signal 118 are produced.

Figure 2:
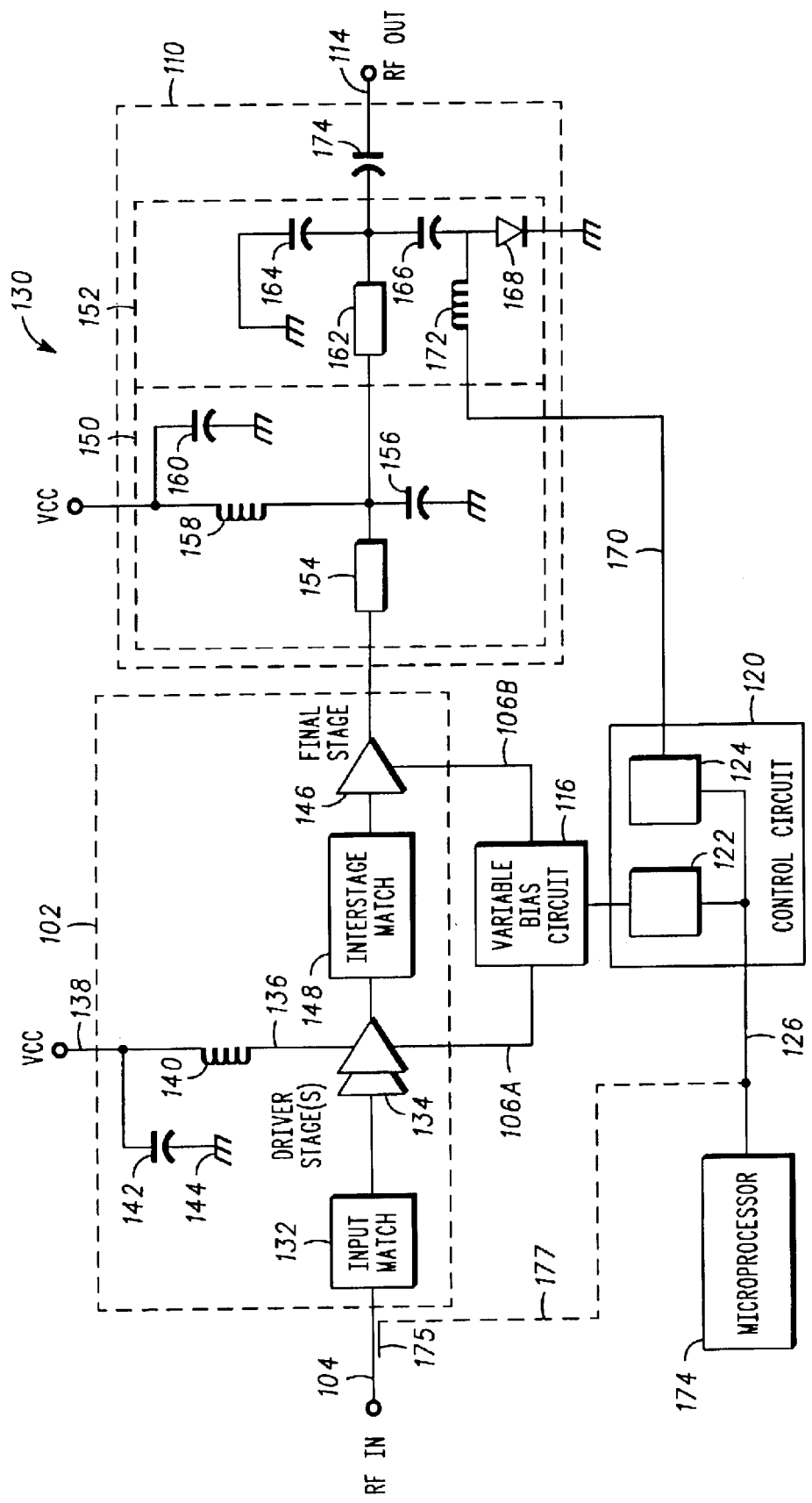
FIG. 2 is a more detailed circuit schematic of the power amplification circuit, illustrated in FIG. 1.

A more detailed circuit schematic 130 of at least one embodiment of the power amplification circuit 100 of FIG. 1 is illustrated in FIG. 2. The power amplifier 102 of the more detailed circuit schematic 130 includes an input match circuit 132 coupled to the input 104. The input match circuit matches the input impedance of the power amplifier 102 to the input impedance of the driver stage amplifier 134. The driver stage amplifier includes an input 106A coupled to the bias input of the driver stage amplifier 134 and a supply input 136 coupled to a voltage supply 138. The voltage supply 138 is coupled to the supply input of the driver stage amplifier 134, via an inductor 140, which filters portions of the signal having alternating current signal components. A capacitor 142 coupled between the voltage supply level 138 and ground 144 provides additional filtering.

The output of the driver stage amplifier 134 is coupled to the input of a final stage amplifier 146, via an interstage match circuit 148. The interstage match circuit 148 is an impedance network that includes impedance elements, like inductors and capacitors, for providing radio frequency matching between the amplifier stages.

Similar to the driver stage 134, the final stage amplifier 146 includes a bias signal input 106B coupled to the variable bias circuit 116. The bias signal received by the final stage in some instance may be the same signal, or different than the bias signal supplied to the driver stage. In instances where the bias signals are different, the variable bias circuit may require separate or additional circuit elements for producing each of the different bias signals. While the power amplifier 102 disclosed in the present embodiment illustrates a power amplifier having at least two amplification stages 134 and 146, the power amplifier 102 could include any number of stages including a power amplifier having a single stage or a power amplifier having a number of stages, that exceeds two. Generally, an interstage match circuit 148 will exist between each sequential amplification stage of the power amplifier 102.

The output of the final stage amplifier 146 is coupled to an output impedance circuit. In the illustrated embodiment, the output impedance circuit is a variable impedance circuit 110. The output impedance circuit can include one or more impedance stages. In the illustrated embodiment, the variable impedance circuit 110 includes two stages 150 and 152. In the illustrated example, only the second stage 152 is capable of being variably adjusted. In other instances it may be beneficial to adapt additional impedance stages, which are also capable of being variably adjusted.

The first stage 150 of the variable impedance circuit 110 includes a transmission line element 154 coupled in series with the output of the power amplifier 102. The end of the transmission line element 154 not directly coupled to the output of the power amplifier 102 is coupled to ground via capacitor 156, and is coupled to the supply power source, via inductor 158. Similar to inductor 140, which is coupled between the voltage supply source 138 and the supply input 136 of the driver stage, inductor 158 filters portions of the signal having AC signal components. Capacitor 160, similar to capacitor 142, provides additional filtering.

The second stage 152 of the variable impedance circuit 110, similar to the first stage, includes a transmission line element 162. The transmission line element 162 is coupled in series with the transmission line element 154 of the first stage 150 of the variable impedance circuit 110. A capacitor 164, serving as an additional impedance element, couples the end of the transmission line element 162 not directly coupled to the transmission line element 154 of the first stage 150 to ground. A second capacitor 166, serves as a further impedance element, which can be selectively coupled to the effective impedance network of the second stage 152 of the variable impedance network 110, when pin diode 168 is enabled.

When pin diode 168 is enabled, the second capacitor 166 is effectively coupled in parallel with capacitor 164. The pin diode 168 is enabled by applying a sufficient DC voltage differential across the diode 168. One end of the diode is coupled to ground. The other end of the diode 168 is coupled to a control signal 170 produced by the control circuit 120, via an inductor 172, which is used to filter AC signal components. Other types of switching elements could alternatively be used in place of the pin diode 168. For example a transistor, like a field effect transistor or a bi-polar transistor, or a microelectromechanical system (MEMs) could alternatively be used. A DC blocking capacitor 174 is coupled between the output of the last (second) stage 152 of the variable impedance circuit 110 and the output 114 of the power amplification circuit 100.

In the illustrated embodiment, the control circuit 120 is coupled to a microprocessor 174, which supplies a signal corresponding to the desired power output level to the control circuit 120. The control circuit 120, then converts the desired output level received from the microprocessor 174 into a bias adjust control signal and an impedance select control signal, which is suitable for use by the variable bias circuit and the variable impedance network, respectively. Alternatively, a directional coupler 175, such as an electromagnetic coupler could be used to detect the signal levels of the input signal, and the detected signal 177 corresponding to the input signal could then be used by the control circuit 120 to determine the bias adjust control signal and an impedance select control signal, especially where the desired power output level is based upon a linear amplification of the input signal 104. While in the illustrated embodiment, the control circuit 120 is separate from the microprocessor 174, in other embodiments, one skilled in the art will readily recognize that the control circuit 120 and the microprocessor 174 could be incorporated into a single combined element.

In accordance with at least one embodiment, at least one of the impedance select control signal and the variable bias adjust signal incorporates hysteretic switching. Specifically, the impedance select control signal and the variable bias adjust signal will change values at a different threshold point dependent upon whether the desired output power levels are transitioning 176 from a higher power level to a lower power level or the desired output power levels are transitioning 178 from a lower power level to a higher power level. By incorporating hysteretic switching at the threshold level that the circuit controlling the change in impedance or the change in bias current switches, the power amplification circuit 100 can limit the number of switches that occur when the power levels are operating at or near one of the transition points. This can eliminate or reduce the occurrence of the ill-effects that sometimes occur in the transmitted signal, such as additional noise or a discontinuity being introduced into the signal, each time that a switch occurs.

Figure 3:
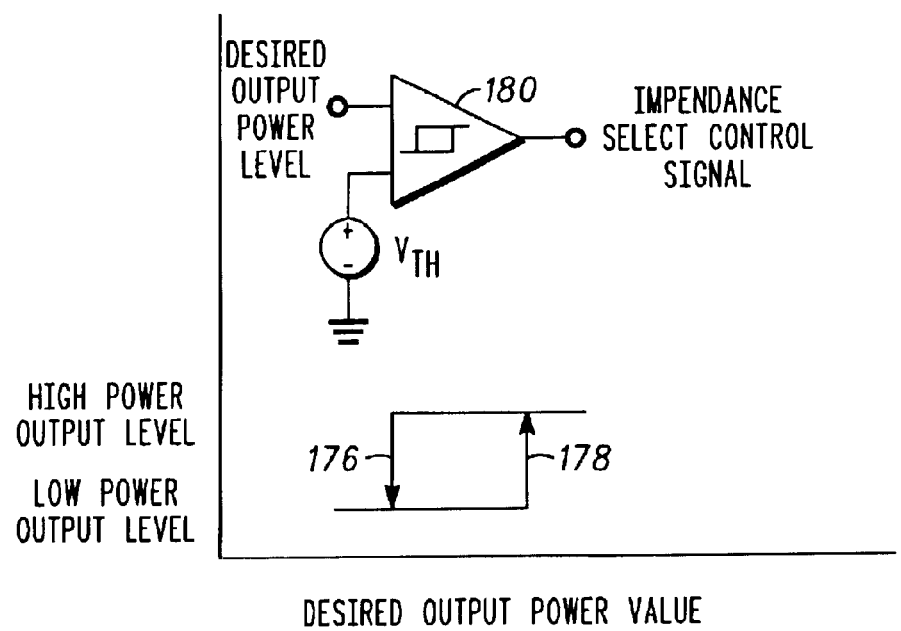
FIG. 3 is a graph and example circuit illustrating the hysteretic switching between predefined power output levels, in accordance with at least one embodiment of the present invention.

An example of a circuit element that can be used to incorporate hysteretic switching includes a hysteretic comparator 180. In the exemplary embodiment, illustrated in FIG. 3, one input of the hysteretic comparator is coupled to the desired output power value, and the other input is coupled to a reference voltage. The corresponding control signal, for example the impedance select control signal 170, is then produced at the output of the hysteretic comparator 180. This embodiment is particularly suitable, when switching between two possible impedance states. In other instances a microprocessor can be programmed to produce the same or similar results, as well as readily producing a control signal for distinguishing between an even greater number of impedance states.

Figure 4:
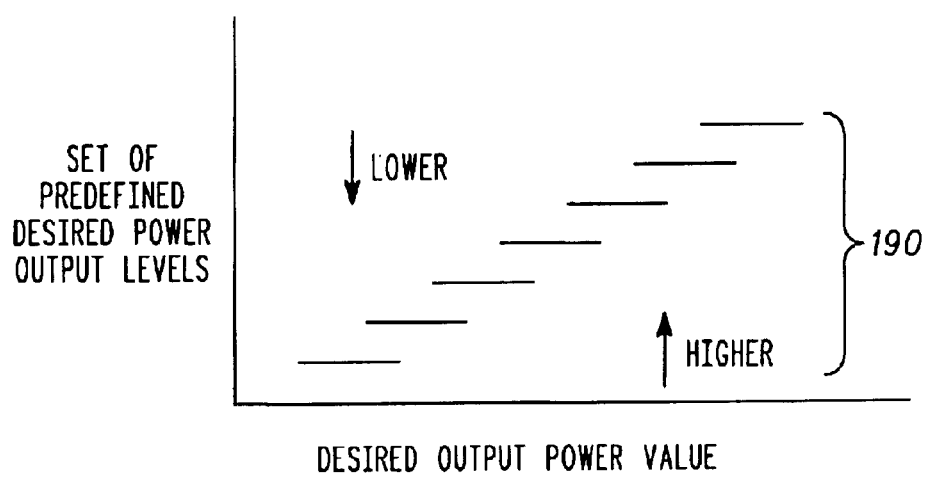
FIG. 4 is a graph of a set of a plurality of predefined desired power output levels, in accordance with at least one embodiment, where the desired power output levels correspond to a range of desired power output levels with overlapping sections.

FIG. 4 is a graph illustrating an example of a set 190 of a plurality of predefined desired power output levels. Generally, each predefined desired power output level will have associated with it, a corresponding bias adjustment value and an impedance select value, which is optimized for more efficient operation over the defined operating range of the predefined desired power output level.

As the desired output power changes, the new desired output power is compared to the operating range of the currently selected predefined desired power output level. If the new desired output power is less than the lower limit of the currently selected predefined desired power output level, then a lower predefined desired power output level, which contains the new desired output power is selected. If the new desired output power is greater than the upper limit of the currently selected predefined desired power output level, then a higher predefined desired power output level, which contains the new desired output power level is selected. By overlapping at least portions of the range of predefined desired output power levels, a hysteretic switching effect can be similarly realized.

In some instances the same impedance select value and/or bias adjust value can be associated with more than one predefined desired power output level. This would allow less than both of the impedance value and the bias value to change, in some circumstances, where the currently selected predefined desired power output level is changing.

Generally, as the desired power output level increases, the value of the bias signal is increased, and the value of the impedance coupled to the output of the power amplifier is decreased. By controlling both the output impedance and the bias signal, together, certain limits in one or the other of the output impedance and the bias signal can be exceeded without exceeding noise limits or the amount of spilled power produced in an adjacent channel. For example, at low power amplification levels, by increasing the load impedance at the output of the power amplifier, the bias signal can be reduced to levels lower then if the output impedance had not been changed. This in turn creates the opportunity for even greater power efficiencies.

Figure 5:
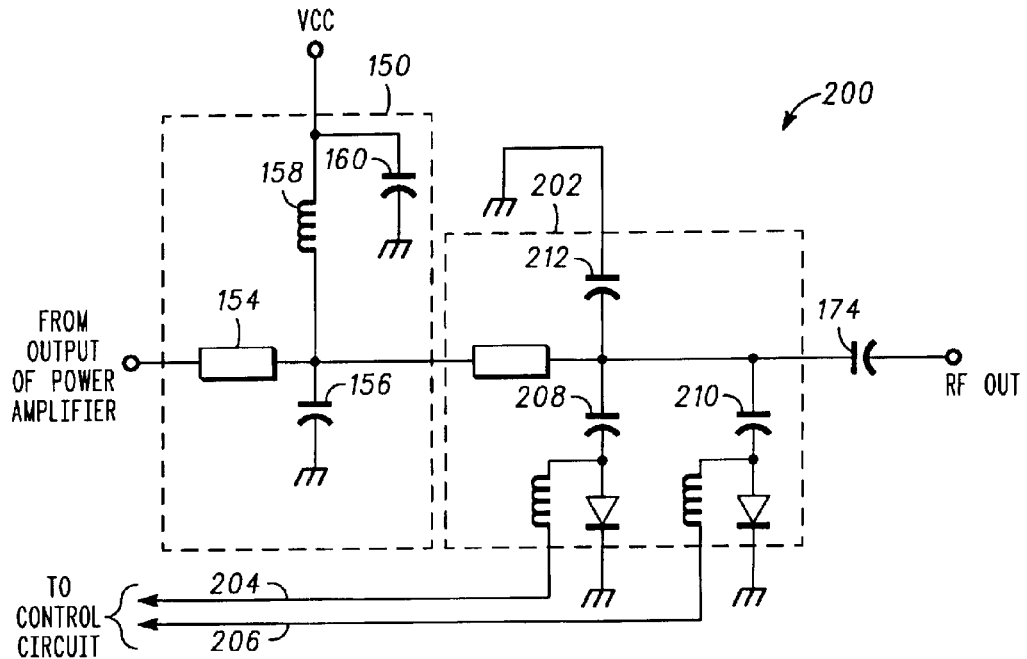
FIG. 5 is a circuit schematic of a variable impedance circuit, in accordance with at least one embodiment, capable of selectively coupling one or two additional impedances in parallel with an impedance already present in the load impedance network.

FIG. 5 illustrates an alternative embodiment of a variable impedance circuit 200 including a second stage 202, which has more than one control line 204, 206 for separately selectively coupling more than one additional impedance 208, 210 in parallel with an existing impedance 212, respectively.

Figure 6:
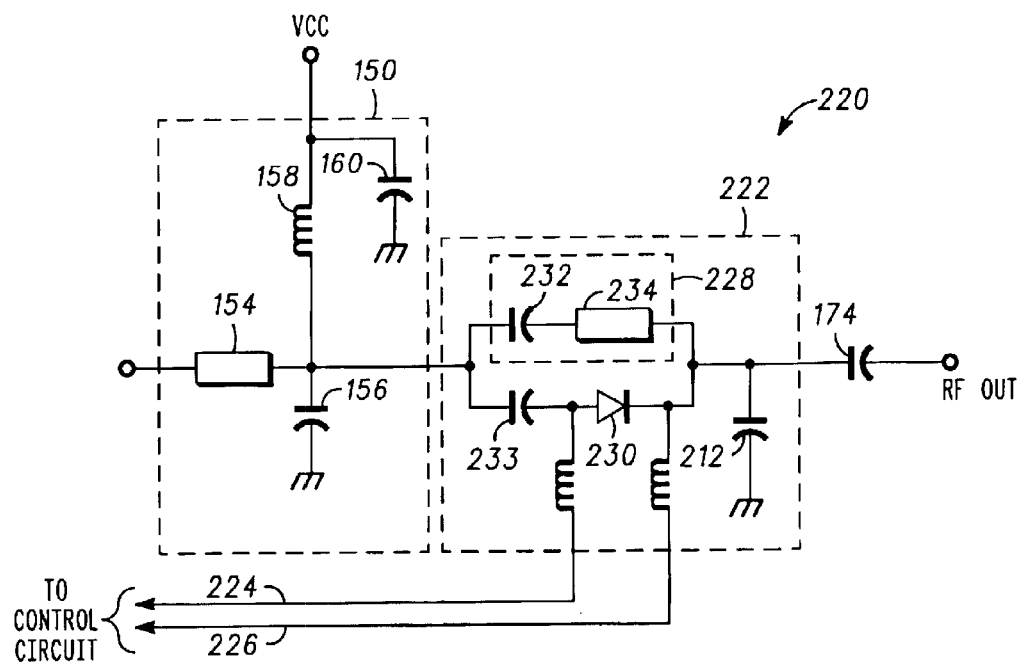
FIG. 6 is a circuit schematic of an alternative impedance circuit, in accordance with at least one embodiment, capable of selectively coupling an additional impedance in series with an impedance already present in the load impedance network.

FIG. 6 illustrates a further alternative embodiment of a variable impedance circuit 220 including a second stage 222, which has a pair of control lines 224, 226 for selectively coupling an impedance 228 in series. Specifically, when a sufficient voltage differential is applied, via control lines 224, 226, across a pin diode 230, a lower impedance alternative signal path is selectively enabled, which allows impedance 228 to be sufficiently bypassed. In the present embodiment impedance 228 includes a DC blocking capacitor 232 in series with a transmission line element 234, and a DC blocking capacitor 233 in series with the pin diode 230.

Figure 7:
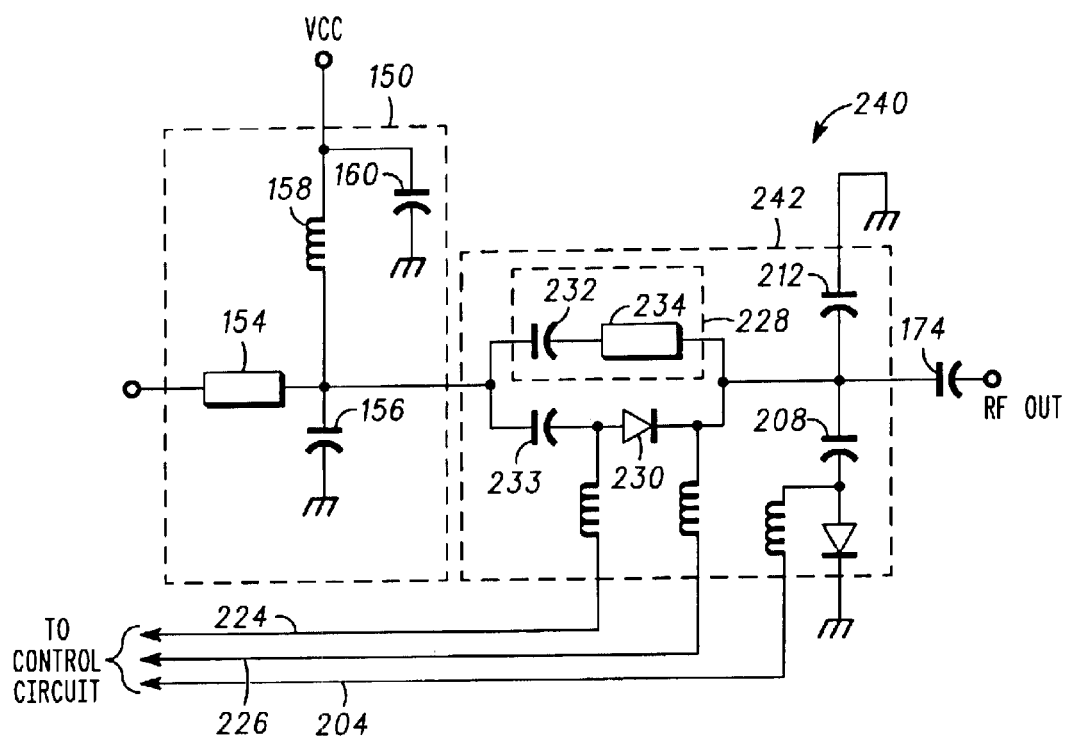
FIG. 7 is a circuit schematic of a still further alternative impedance circuit, in accordance with at least one embodiment, including an additional impedance, which can be selectively coupled in parallel with an existing impedance, and a further additional impedance, which can be selectively coupled in series with an existing impedance.

FIG. 7 illustrates a still further alternative embodiment of a variable impedance circuit 240 including a second stage 242, which in addition to selectively coupling an impedance 228 in series, as shown in FIG. 6, allows for an impedance 244 to be selectively coupled in parallel to an existing impedance 212, as shown in FIGS. 2 and 5.

Figure 8:
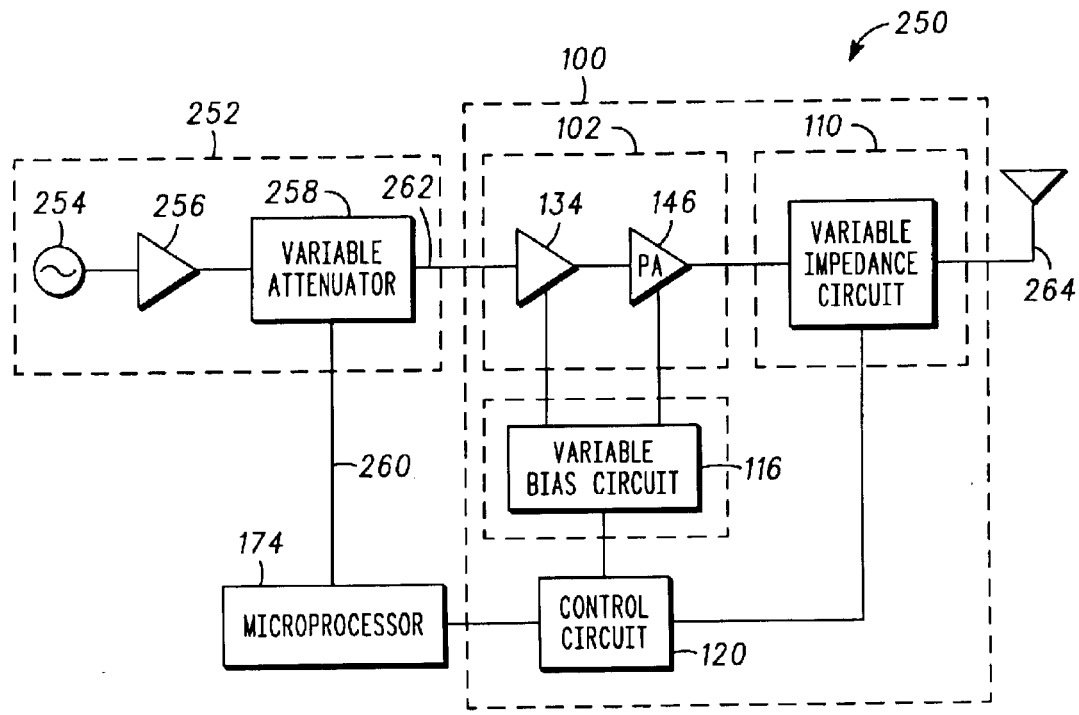
FIG. 8 is a block diagram of a transmitter, incorporating the power amplification circuit illustrated in FIG. 1.

FIG. 8 illustrates an example of a transmitter, which incorporates the features of the present invention. More specifically, FIG. 8 illustrates a block diagram 250 of a transmitter, which incorporates RF input circuitry 252 and the power amplification circuit 100 illustrated in FIGS. 1 and 2. In particular, a voltage controlled oscillator (VCO) 254 is used to combine an information signal with an oscillating signal at a predetermined frequency to create a frequency modulated information signal. The frequency modulated information signal is then coupled to a buffer 256 that functions both as a filter, typically a passband filter, and an amplification device that increases the magnitude of the frequency modulated information signal. After amplification by the buffer 256, the output of the buffer is coupled through a variable attenuator 258 which can be adjusted by an amplifier control signal 260 to provide high attenuation when the transmitter 250 is not transmitting or low attenuation to permit transmission of an RF input signal 262.

The RF input signal 262 is then coupled to a driver stage 134 that forms an initial stage of a power amplifier 102. The output of the driver stage 134 is coupled to an input of amplifier 146, which forms the final stage of the power amplifier 102. Upon receiving the RF signal from the driver stage 134 of the power amplifier 102, the final stage 146 of the power amplifier 102 further amplifies the RF signal to generate an RF output signal, which is coupled to an antenna 264, via the variable impedance circuit 110, coupled to the output of the power amplifier 102.

Figure 9:
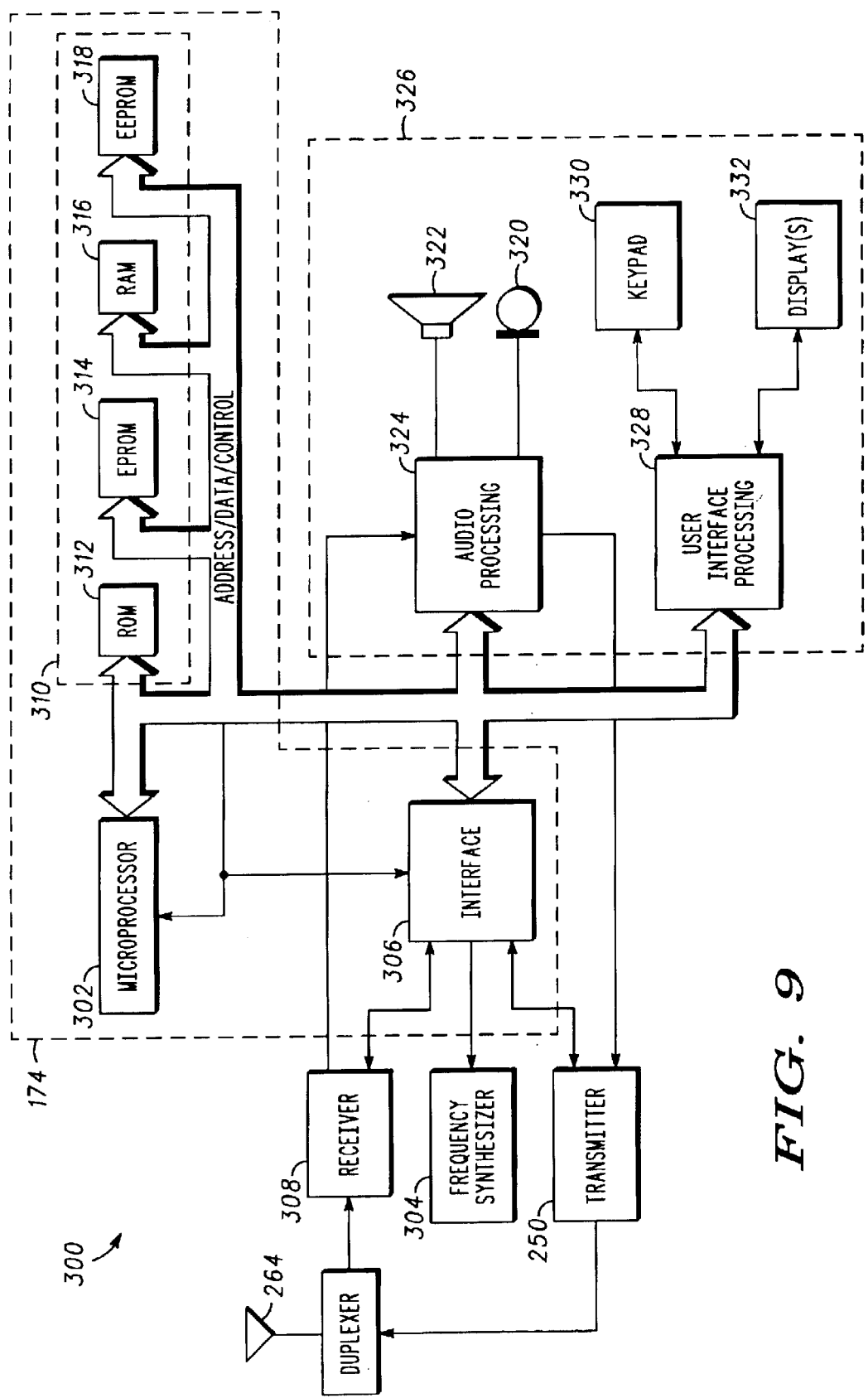
FIG. 9 is a block diagram of a wireless communication device, within which the transmitter of FIG. 8, and the power amplification circuit of FIG. 1, can be incorporated.

FIG. 9 illustrates a block diagram of a wireless communication device 300, like a cellular telephone, within which the transmitter of FIG. 8, and the power amplification circuit of FIG. 1 can be further incorporated to enable the wireless communication device 300 to enjoy the benefits of the present invention. In the wireless communication device 300, illustrated in FIG. 9, the particular radio frequency is determined by the microprocessor 302. The particular radio frequency is conveyed to the frequency synthesizer 304 via the interface circuitry 306. Data signals received by the receiver 308 are decoded and coupled to the microprocessor 302 by the interface circuitry 306, and data signals to be transmitted by the transmitter 250 are generated by the microprocessor 302 and formatted by the interface circuitry 306 before being transmitted by the transmitter 250. Operational status of the transmitter 250 and the receiver 308 is enabled or disabled by the interface circuitry 306.

In the preferred embodiment, the microprocessor 302 forms part of the processing unit 174, which in-conjunction with the interface circuitry 306 performs the necessary processing functions under the control of programs stored in a memory section 310. Together, the microprocessor 302 and the interface circuitry 306 can include one or more microprocessors, one or more of which may include a digital signal processor (DSP). The memory section 310 includes one or more forms of volatile and/or non-volatile memory including conventional ROM 312, EPROM 314, RAM 316, or EEPROM 318. One skilled in the art will readily recognize that other types of memory are possible.

Characterizing features of the wireless communication device are typically stored in EEPROM 318 (which may also be stored in the microprocessor in an on-board EEPROM, if available) and can include the number assignment (NAM) required for operation in a conventional cellular system and/or the base identification (BID) required for operation with a cordless base. Additionally stored in the memory section 310 are the multiple sets of prestored instructions used in supplying power to a load over an extended range including adjusting a bias signal supply level and selecting an output impedance dependent upon the selected desired power output level.

Control of user audio, the microphone 320 and the speaker 322, is controlled by audio processing circuitry 324, which forms part of a user interface circuit 326. The user interface circuit 326 additionally includes user interface processing circuitry 328, which manages the operation of any keypad(s) 330 and/or display(s) 332. It is further envisioned that any keypad operation could be included as part of a touch sensitive display.

Figure 10:
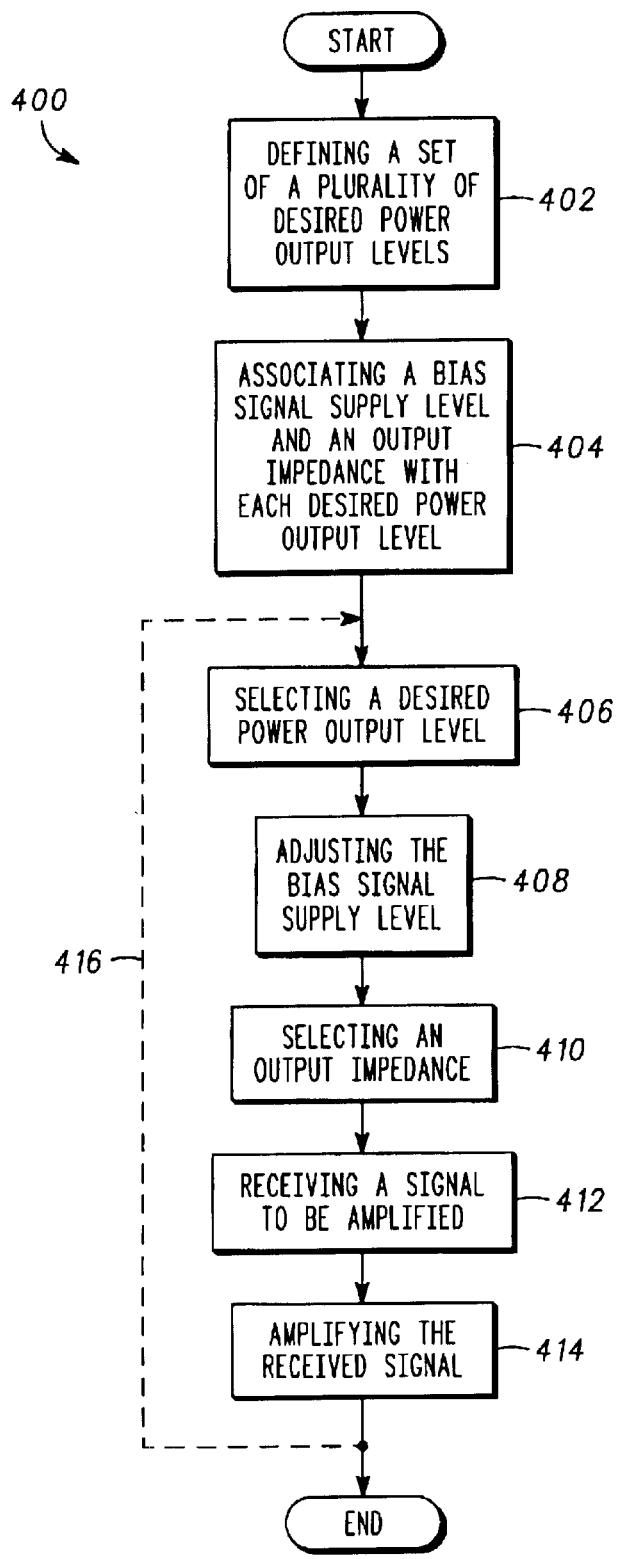
FIG. 10 is a flow diagram of a method for supplying power at a plurality of desired power output levels in accordance with at least one embodiment of the present invention.

FIG. 10 illustrates a flow diagram of a method 400 directed to supplying power at a plurality of desired power output levels in accordance with at least one embodiment of the present invention. The method includes defining 402 a set of a plurality of desired power output levels, where a bias signal supply level and an output impedance is associated 404 with each desired power output level. Generally, each of the desired power output levels is a subset of the extended operating range of the power amplification circuit. In at least one embodiment, each of the defined power output levels corresponds to a range of desired output power values.

After the set of desired power output levels are defined, and a bias signal supply level and an output impedance is associated with each of the desired power output levels, a particular desired power output level is selected 406.

Depending on the desired power output level that is selected, a bias signal supply level is adjusted 408 and an output impedance is selected 410, to correspond to the selected desired power output level. A signal to be amplified is then received 412, and the received signal is amplified 414. The method continues to amplify a received signal, until a new desired power output level is selected 416.

Figure 11:
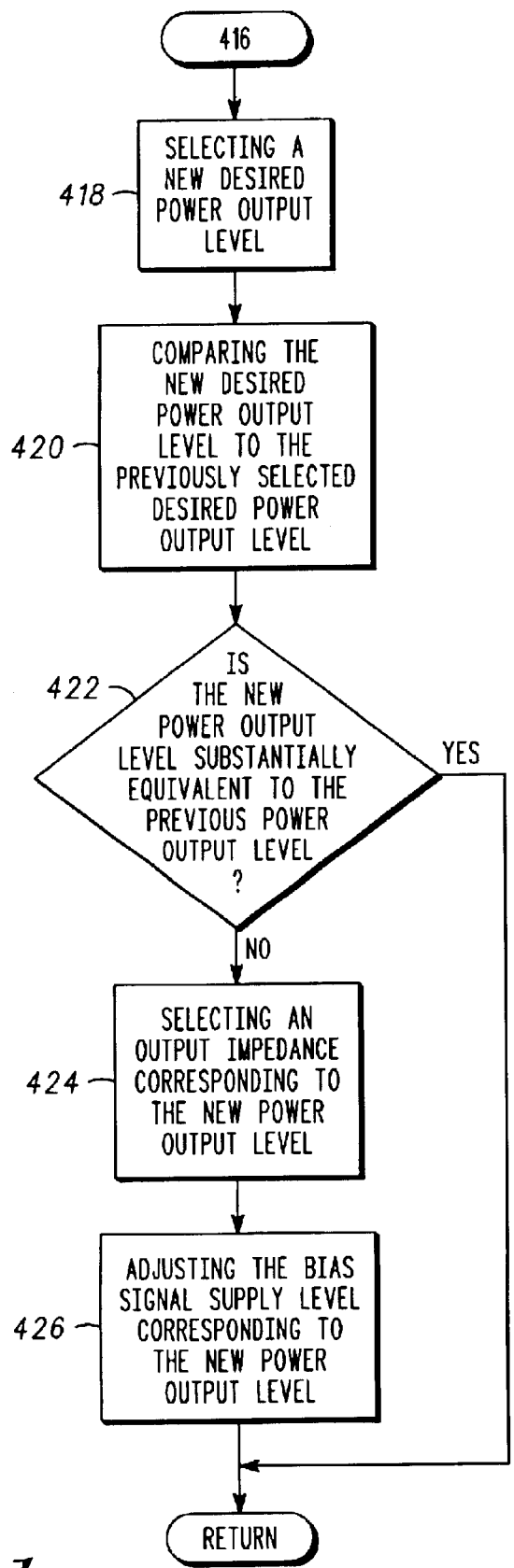
FIG. 11 is a more detailed flow diagram of the method illustrated in FIG. 10, including selecting a new desired power output level.

FIG. 11 illustrates a more detailed flow diagram of selecting a new desired power output level in association with the method illustrated in FIG. 10. Specifically, the method includes selecting 418 a new desired power output value. The new desired power output level is then compared 420 to the previously selected desired power output level. If the new desired power output level is not substantially equivalent to the previous power output level 422, then an output impedance corresponding to the new power output level is selected 424, and a bias signal supply level corresponding to the new power output level is adjusted 426. Where the defined desired power output levels correspond to a range of power output values, a determination is made as to whether the new desired power output value falls within the ranges of values included in the present selected desired power output levels. If the new power output value is substantially equivalent to the previously selected power output level, then the presently selected output impedance and the bias signal supply levels are maintained.

While the present inventions and what are considered presently to be the best modes thereof have been described in a manner that establishes possession thereof by the inventors and that enables those of ordinary skill in the art to make and use the inventions, it will be understood and appreciated that there are many equivalents to the exemplary embodiments disclosed herein and that myriad modifications and variations may be made thereto without departing from the scope and spirit of the inventions, which are to be limited not by the exemplary embodiments but by the appended claims.

What is claimed is:

1. A method in a power amplifier, comprising:
    changing between high and low power outputs of the power amplifier when amplifying a signal having a common modulation format;
    applying a different bias to the power amplifier at the low power output than a bias applied to the power amplifier at the high power output; and
    loading an output of the power amplifier with a different impedance at the low power output than an impedance loaded at the output of the power amplifier output at the high power output;
    wherein changing between high and low power outputs of the power amplifier occurs at a different threshold level dependant upon whether the power amplifier is transitioning from the high power output to the low power output, or whether the power amplifier is transitioning from the low power output to the high power output.

2. A method in a power amplifier, comprising:
    changing between high and low power outputs of the power amplifier when amplifying a signal having a common modulation format;
    applying a different bias to the power amplifier at the low power output than a bias applied to the power amplifier at the high power output; and
    loading an output of the power amplifier with a different impedance at the low power output than an impedance loaded at the output of the power amplifier output at the high power output;
    wherein applying a different bias to the power amplifier includes applying a reduced bias to the power amplifier at the low power output relative to a bias applied at the high power output, and loading an output of the power amplifier with a different impedance includes applying an increased impedance at the low power output relative to the impedance applied at the high power output.

3. A method in a power amplifier having high and low power outputs in an operating range thereof, comprising:
    changing between the high and low power outputs of the power amplifier;
    applying a reduced bias to the power amplifier at the low power output relative to a bias applied thereto at the high power output;
    applying an increased load to an output of the power amplifier when operating at the low power output relative to a load applied thereto when operating at the high power output.

4. The method of claim 3 wherein changing between high and low power outputs of the power amplifier occurs at a different threshold level dependant upon whether the power amplifier is transitioning from the high power output to the low power output, or whether the power amplifier is transitioning from the low power output to the high power output.

5. The method of claim 3 wherein changing between high and low power outputs of the power amplifier includes detecting the value of an input signal received by the power amplifier and changing between high and low power outputs of the power amplifier based on the detected value of the input signal received by the power amplifier.

6. A method in a power amplifier having high and low power outputs in an operating range thereof, comprising:
    reducing power consumption of the power amplifier by applying a reduced bias to the power amplifier when operating at the low output power relative to a bias applied to the power amplifier at the high output power;
    decreasing a level to which the bias maybe reduced when operating at the low output power in the operating range of the power amplifier by increasing the impedance of a load applied to an output of the power amplifier when operating at the low output power relative to a load applied to the power amplifier output when operating at the high output power.

7. A power amplification circuit comprising:
    a power amplifier having an output with high and low output power levels in an operating range of the power amplification circuit;
    a variable bias circuit coupled to the power amplifier, the variable bias circuit having at least a first and second power amplifier bias configurations;
    a variable impedance circuit coupled to the output of the power amplifier, the variable impedance circuit having at least a first and second power amplifier impedance configurations,
    wherein the power amplifier is configured in a reduced bias configuration at the low output power level relative to the bias configuration of the power amplifier at the high output power level, and the power amplifier is loaded with an increased impedance at the low output power level relative to the loading of the power amplifier at the high output power level.

8. The power amplification circuit of claim 7 wherein the variable bias circuit has a bias control input coupled to an input of the power amplifier, and the variable impedance circuit has an impedance control input coupled to the input of the power amplifier.

9. The power amplification circuit of claim 7 further comprising a controller having a control output coupled to the variable bias circuit and to the variable impedance circuit, wherein the controller is adapted for configuring the variable bias circuit and the variable impedance circuit based on a desired power amplifier output signal.

10. The power amplification circuit of claim 9 wherein the variable impedance circuit comprises impedance elements coupled by a switch, and wherein the controller is adapted for configuring the variable impedance circuit by actuating the switch at different power amplifier output power levels depending on whether the power amplifier is switching from high to low output power levels or from low to high output power levels.

11. The power amplification circuit of claim 7 further comprises a hysteretic comparator for determining when the power amplifier transitions between low and high output power levels.

12. A power amplification circuit for supplying power to a load over an extended range including a set of a plurality of predefined desired power output levels, each desired power output level being a subset of the extended range, the power amplification circuit comprising:
  a power amplifier including a first input for receiving a signal to be amplified, a second input for receiving a bias signal, and an output for producing an amplified signal;
  a control circuit including a bias adjust circuit, and an impedance select circuit, for receiving a signal, which selects one of the desired output power levels, and for producing a bias adjust control signal and an impedance select control signal;
  a variable impedance circuit, coupled to the output of the power amplifier and the impedance select circuit of the control circuit, the variable impedance circuit including a plurality of impedance states, which are separately selectable, each impedance state corresponding to at least one of the ranges of desired power output levels; and
  a variable supply, coupled to the power amplifier and the bias adjust circuit of the control circuit, for receiving the bias adjust control signal and supplying an adjusted bias signal to the second input of the power amplifier;
  wherein each of the predefined power output levels is a range of desired power output levels;
  wherein portions of each of the desired power output level ranges overlap with portions of other desired output level ranges in the set of predefined power output levels; and
  wherein the control circuit includes a processor unit, coupled to the bias adjust circuit and the impedance select circuit, including
    a processor;
    a storage unit coupled to said processor for storing one or more sets of instructions for execution by the processor including
    prestored instructions for receiving a new desired power output level and comparing the new desired power output level to the present selected range of desired power output level,
    prestored instructions for selecting a new range of desired power output level, which includes the new desired power output level, if the present selected range of desired power output level does not include the new desired power output level, and
    prestored instructions for producing an impedance select control signal for selecting the impedance of the variable impedance network and for producing a bias adjust control signal for adjusting the bias signal produced by the variable supply, which corresponds to the new selected range of desired power output level.

13. A power amplification circuit for supplying power to a load over an extended range including a set of a plurality of predefined desired power output levels, each desired power output level being a subset of the extended range, the power amplification circuit comprising:
  a power amplifier including a first input for receiving a signal to be amplified, a second input for receiving a bias signal, and an output for producing an amplified signal;
  a control circuit including a bias adjust circuit, and an impedance select circuit, for receiving a signal, which selects one of the desired output power levels, and for producing a bias adjust control signal and an impedance select control signal;
  a variable impedance circuit, counted to the output of the power amplifier and the impedance select circuit of the control circuit, the variable impedance circuit including a plurality of impedance states, which are separately selectable, each impedance state corresponding to at least one of the ranges of desired power output levels; and
  a variable supply, coupled to the power amplifier and the bias adjust circuit of the control circuit, for receiving the bias adjust control signal and supplying an adjusted bias signal to the second input of the power amplifier;
  wherein the control circuit includes a processor unit, coupled to the bias adjust circuit and the impedance select circuit, including
    a processor;
    a storage unit coupled to said processor for storing one or more sets of instructions for execution by the processor including
    prestored instructions for receiving a new desired power output level and comparing the new desired power output level to the present selected desired power output level,
    prestored instructions for producing an impedance select control signal for selecting the impedance of the variable impedance network and for producing a bias adjust control signal for adjusting the bias signal produced by the variable supply, which corresponds to the new selected desired power output level, if the present selected desired power output level is not substantially equivalent to the new desired power output level.

14. A method of supplying power to a load via a power amplification circuit over an extended range comprising:
  defining a set of a plurality of desired power output levels, where each power output level is a subset of the extended range;
  associating a bias signal supply level and an output impedance with each desired power output levels;
  selecting a desired power output level;
  adjusting the bias signal supply level, corresponding to the selected desired power output level;
  selecting an output impedance, corresponding to the selected desired power output level;
  receiving a signal to be amplified; and
  amplifying the received signal;
  wherein, when a new desired power output level is selected, if the new desired power level is higher than the previous desired power level, the bias current is increased and a smaller output impedance is selected, and if the new desired power level is lower than the previous desired power level, the bias current is decreased and a larger output impedance is selected.

15. A method of supplying power to a load via a power amplification circuit over an extended range comprising:

defining a set of a plurality of desired power output levels, where each power output level is a subset of the extended range;

associating a bias signal supply level and an output impedance with each desired power output levels;

selecting a desired power output level;

adjusting the bias signal supply level, corresponding to the selected desired power output level;

selecting an output impedance, corresponding to the selected desired power output level;

receiving a signal to be amplified; and amplifying the received signal;

wherein each defined desired power output level is a range of desired power output levels, corresponding to a subset of the extended range over which the power amplification circuit operates; and wherein defining a set of a plurality of desired power levels includes defining a plurality of ranges of desired power levels, where a portion of each of the plurality of ranges overlap with portions of other desired output level ranges; and said method further comprising selecting a new desired power output value;

comparing the new desired power output value to the present selected range of desired power output level; and if the new desired power output value is not included within the present selected range of desired power output level, then selecting a new range of desired power output level, that includes the new desired power output value, and adjusting the bias signal supply level and selecting an output impedance, corresponding to the new selected range of desired power output level.

16. A method of supplying power to a load via a power amplification circuit over an extended range comprising:

defining a set of a plurality of desired power output levels, where each power output level is a subset of the extended range;

associating a bias signal supply level and an output impedance with each desired power output levels;

selecting a desired power output level;

adjusting the bias signal supply level, corresponding to the selected desired power output level;

selecting an output impedance, corresponding to the selected desired power output level;

receiving a signal to be amplified;

amplifying the received signal;

selecting a new desired power output value;

comparing the new desired power output value to the previously selected desired power output level; and if the new desired power output value is not substantially equivalent to the previously selected power output level, then selecting a new desired power output level corresponding to the now desired power output value and adjusting the bias signal supply level and selecting an output impedance, corresponding to the new desired power output level.

* * * * *